United States Patent
Weber

[19]

[11] Patent Number: 6,161,688
[45] Date of Patent: *Dec. 19, 2000

[54] ARRANGEMENT OF AT LEAST ONE OF ELECTRICAL COMPONENTS AND OPTICAL COMPONENTS IN A GAS-TIGHT PACKAGING AND METHOD FOR MANUFACTURING THE SAME

[75] Inventor: Jens Weber, Kelkheim-Fischbach, Germany

[73] Assignee: Robert Bosch GmbH, Stuttgart, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/924,411

[22] Filed: Aug. 27, 1997

[30] Foreign Application Priority Data

Aug. 27, 1996 [DE] Germany .............. 196 34 523

[51] Int. Cl.$^7$ ...................................... H05K 5/06
[52] U.S. Cl. ................ 206/213.1; 206/726; 53/434
[58] Field of Search ............... 206/524.8, 701, 206/715, 726, 727, 722, 205, 213.1; 53/86, 432, 434

[56] References Cited

U.S. PATENT DOCUMENTS

| | | |
|---|---|---|
| 5,080,155 | 1/1992 | Crozier . |
| 5,274,914 | 1/1994 | Kitamura et al. . |
| 5,376,424 | 12/1994 | Watanabe ........................ 206/524.8 |
| 5,403,973 | 4/1995 | Santilli et al. . |
| 5,545,494 | 8/1996 | Trumble et al. ................ 206/701 X |
| 5,579,919 | 12/1996 | Gilman et al. ................. 206/727 X |

FOREIGN PATENT DOCUMENTS

| | | |
|---|---|---|
| 0 508 286 | 10/1992 | European Pat. Off. . |
| 0 508 286 | 9/1995 | European Pat. Off. . |
| 573847 | 3/1976 | Switzerland . |
| 1569479 | 6/1980 | United Kingdom . |
| WO 94/18815 | 8/1994 | WIPO . |
| WO 95/28072 | 10/1995 | WIPO . |
| WO 96/27279 | 9/1996 | WIPO . |

*Primary Examiner*—Jacob K. Ackun
*Attorney, Agent, or Firm*—Kenyon & Kenyon

[57] ABSTRACT

An arrangement to provide electrical and/or optical components in a gas-tight packaging, which includes a film that at least partially covers the electrical and/or optical components, to provide a very simple manufacturing result. The arrangement provides an optimal protection of the components enclosed in the packaging. In addition, the film can be constituted as a film-type wrapping which completely encloses the electrical and/or optical components and their leads and which is filled with a pressurized protective gas.

6 Claims, 1 Drawing Sheet

ARRANGEMENT OF AT LEAST ONE OF ELECTRICAL COMPONENTS AND OPTICAL COMPONENTS IN A GAS-TIGHT PACKAGING AND METHOD FOR MANUFACTURING THE SAME

FIELD OF THE INVENTION

The present invention relates to an arrangement of electrical and/or optical components in a gas-tight packaging, which includes a film that at least partially covers the electrical and/or optical components.

BACKGROUND INFORMATION

There has been a need to configure electrical and/or optical components in a gas-tight packaging, in order to keep harmful gases, such as oxygen, water vapor or the like away from the components.

Thus, it is known to configure components in a gas-tight, fixed housing of metal or plastic that is used as a packaging. In this context, the housing is evacuated or filled with a protective gas. What is problematic about a conventional arrangement, however, is the seal tightness of the housing, in particular the seal tightness of the joints, of the housing cover; as well as of the lead-through areas of terminal leads, e.g. glass fiber leads or electrical leads, into the housing interior. Moreover, conventional housings are complicated to manufacture and are, therefore, also expensive.

European Patent No. 0 508 286 describes a conventional arrangement which includes a film that at least partially covers the components.

Enclosed between the components and the film is a volume of air space, which is kept as small as possible. On the one hand, the film is constituted as a film-type wrapping which completely encloses the electrical and/or optical components and their leads and which is filled with a protective gas that is pressurized to a level above atmospheric pressure. The film enables a simple sealing action, on the other hand, because of its flexibility, an adaptation to varying temperature conditions.

This arrangement is disadvantageous due to the volume of air space enclosed between the components and the film. Such enclosed air volume may have an adverse effect on the enclosed components. For this reason, the components must be coated with a protective varnish to make them insensitive to environmental influences.

Therefore, an object of the present invention is to improve an arrangement of electrical and/or optical components in a gas-tight packaging so that, given a simplest possible manufacturing, the arrangement will make it possible to prove an optimal protection of the components enclosed in the packaging.

SUMMARY OF THE INVENTION

The present invention provides means for attaining this object by enclosing the electrical and/or optical components and their leads in a film-type wrapping, which is filled with a protective gas that is pressurized to a level above atmospheric pressure, one of the attained benefits is that, on the one hand, the arrangement according to the present invention can be easily manufactured and, therefore, cost-effectively and that, on the other hand, harmful gases, such as oxygen or water vapor, which could cause corrosion, oxidation or otherwise adversely affect the electrical and/or optical components, are kept completely away from the electrical and/or optical components, since these components are situated in an atmosphere of a protective gas. Because this protective-gas atmosphere is charged with a pressure greater than atmospheric pressure, atmospheric air is also prevented quite effectively from being able to attain the components, since even in the event of insignificant leakage (or a small leak) caused, for example, by some damage, the protective gas can escape into the atmosphere. There can also be no ingress of atmospheric air into the interior of the film-type wrapping.

The most widely varying realizations of the film-type wrapping are possible. In particular, with respect to a manufacturing that is problem-free in terms of engineering and, therefore, is also cost-effective, the film-type wrapping is sealed by heat-sealing (or welding), at least one weld being formed, through which the electrical and/or optical terminal leads are run. Arranging the electrical and/or optical terminal leads in the weld makes it possible for the electrical and/or optical components to be electrically and/or optically connected in a simple and, at the same time, gas-tight manner to other circuit components arranged outside of the film-type wrapping.

Many different devices can be used to provide strain relief for the terminal leads. It is especially beneficial, however, for the weld itself to constitute a strain relief for the terminal leads, so that the need is eliminated for additional strain relief means.

In particular, to route as few as possible terminal leads from inside the film-type wrapping to the outside and, thus, to keep the number of potential leakage points as low as possible, provision is advantageously made for the electrical and/or optical components to be a part of one single integrated component, whose bonding wires are routed to a frame that is configured inside the wrapping and is joined to the integrated component. Because the integrated component and its bonding parts are configured inside the film-type wrapping, an optimal protection is assured for the integrated component and its electrical and/or optical leads.

In addition, the object of the present invention is further achieved by a method for manufacturing an arrangement of electrical and/or optical components in a gas-tight packaging, in which the electrical and/or optical components and their leads are inserted in a film-type wrapping that completely surrounds the components, in a protective gas atmosphere that is pressurized to a level above atmospheric pressure, and in which the film-type wrapping is then sealed in a gas-tight manner.

It is beneficial to seal the film-type wrapping in a gas-tight manner by means of heat-sealing (and forming at least one weld). Such sealing is simple and cost-effective.

Moreover, it is further advantageous to arrange terminal leads in the weld and to join them in a gas-tight manner to the film-type wrapping during the heat-sealing operation. Thus, it is not only assured that the terminal leads (which are routed to the inside of the film-type wrapping) are sealed in a simple manufacturing method, but also by configuring the terminal leads in such manner, the weld itself provides a simple strain relief for the lead wires arranged in the film-type wrapping.

DETAILED DESCRIPTION

Figure 1:
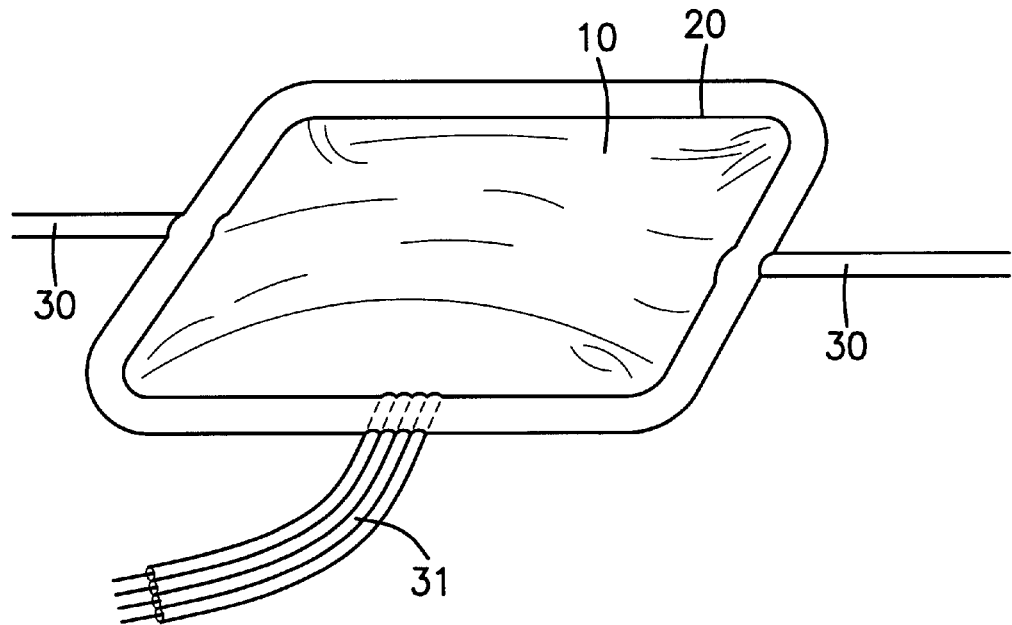
FIG. 1 shows an arrangement of electrical and/or optical components in a gas-tight packaging according to the present invention.

An exemplary embodiment of an arrangement of electrical and/or optical components in a gas-tight packaging according to the present invention, as shown in FIG. 1, includes a film-type wrapping 10, made of a film material which is impervious to gas (e.g., which is transparent and can include two halves that are heat sealed together by a weld 20). The film-type wrapping 10 is filled with a pressurized protective gas, so that it is curved like a balloon.

Routed to the inside of film-type wrapping 10 are terminal leads, e.g. optical fiber cables 30 and an electrical flat ribbon cable 31. In this context, optical fiber cables 30 as well as electrical flat ribbon cable 31 are routed through weld 20. Gas-tight connections of the sheaths of fiber cables 30 as well as of flat ribbon cable 31 to film-type wrapping 10 in the area of weld 20 assure, on one hand, an optimal sealing off of the inside of film-type wrapping 10 from the ambient environment, on the other hand, a stable connection of film-type wrapping 10 to the sheaths of fiber cables 30 as well as of flat ribbon cable 31. In this context, weld 20, which constitutes a frame that surrounds the electrical and/or optical components and is stabilized by the heat-sealing, functions as a strain relief.

Figure 2:
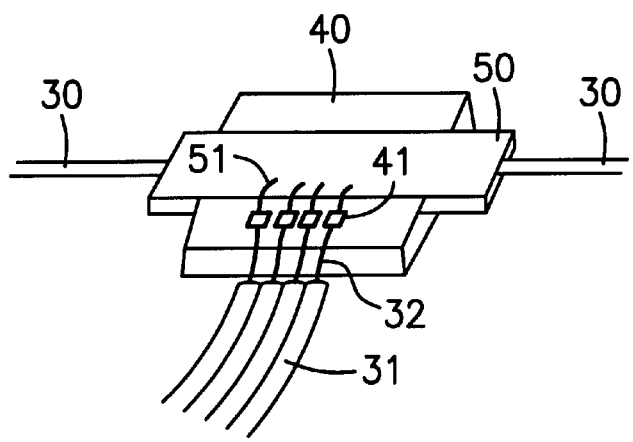
FIG. 2 shows an integrated optical component arranged on a frame mounted in the packaging illustrated in FIG. 1.

FIG. 2 shows an integrated, optical component 50 which is mounted on a frame 40 and which, e.g., can be inserted into a film-type wrapping 10 illustrated in FIG. 1. As is apparent from FIG. 2, integrated, optical component 50 is mounted on a frame 40, upon which connector contacts 41 are provided for bonding wires 51. Together with integrated component 50, frame 40 is completely enclosed by film-type wrapping 10 (not shown), so that sensitive bonding wires 51 are protected from environmental influences, but due to the pressure above atmosphere prevailing inside film-type wrapping 10, also from mechanical influences. In this context, lead wires 32 of flat ribbon cable 31 are directly joined, e.g., by using a soldered connection, to connector elements 41 arranged on the frame.

The arrangement shown in FIG. 1 is provided by inserting, for example, the integrated, optical component 50 shown in FIG. 2 into a film-type wrapping 10, completely surrounding component 50 in a protective gas atmosphere pressurized to a level above the atmospheric pressure, and by then sealing film-type wrapping 10 in a gas-tight manner by heat-sealing, forming weld 20. Thus, terminal leads 30, 31 arranged in weld 20 are joined in a gas-tight manner to film-type wrapping 10 during the heat-sealing operation.

As soon as the constructed arrangement is exposed to normal atmospheric pressure, the heat-sealed, film-type wrapping 10 swells like a balloon. The protective gas contained in film-type wrapping 10, which has undergone such a balloon-like expansion, prevents any corrosion or oxidation or other adverse influences from acting on integrated component 50 situated inside film-type wrapping 10 and on its terminal leads 30, 31 and/or bonding wires 51.

Even in the event of insignificant leakage a small leak caused, for example, by some slight damage to film-type wrapping 10, protective gas from inside film-type wrapping 10 first penetrates into the atmosphere because of the pressure above atmosphere prevailing in the interior, so that air is prevented from penetrating into the inside of film-type wrapping 10.

Moreover, the pressurized film-type wrapping 10, which has undergone a balloon-like expansion, also provides a mechanical protection for the components and their corresponding lead wires contained inside of it.

What is claimed is:

1. A method for manufacturing an arrangement of at least one of electrical components and optical components in a gas-tight packaging, comprising the steps of:

in a protective gas atmosphere having a pressure greater than atmospheric pressure, inserting the components and terminal leads of the components in a film-type wrapping to completely surround the components; and in the protective gas atmosphere, gas-tight sealing the film-type wrapping which is composed of a gas-impermeable material, wherein gas is contained directly between at least a portion of an inner surface of the film-type wrapping and at least a portion of an outer surface of:

at least one of the components, or at least one of the terminal leads; and wherein the gas has a pressure which is greater than atmospheric pressure.

2. The method according to claim 1, wherein the components include at least one of electrical components and optical components.

3. The method according to claim 1, wherein the step of sealing the film-type wrapping includes the step of heat-sealing the film-type wrapping to form at least one weld.

4. The method according to claim 3, wherein, during the heat-sealing of the film-type wrapping, the terminal leads of the components are arranged in the at least one weld and are gas-tightly coupled to the film-type wrapping.

5. The method according to claim 1, wherein the portion of the inner surface is directly adjacent to the portion of the outer surface.

6. The method according to claim 1, wherein the gas directly contacts the portion of the inner surface and the portion of the outer surface, without the gas contacting a protective layer.

* * * * *